US006307406B1

(12) United States Patent
Smith

(10) Patent No.: US 6,307,406 B1
(45) Date of Patent: *Oct. 23, 2001

(54) CURRENT COMPARATOR FOR CURRENT MODE CIRCUITS

(75) Inventor: Malcolm H. Smith, Phoenix, AZ (US)

(73) Assignee: Lucent Technologies, Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,410

(22) Filed: Sep. 25, 1998

(51) Int. Cl.⁷ ..................................................... G11C 27/02
(52) U.S. Cl. .................................. 327/94; 327/96; 327/63
(58) Field of Search ................................. 327/50, 51, 52, 327/53, 54, 55, 56, 57, 63, 64, 65, 66, 70, 90, 91, 92, 93, 94, 96, 97

(56) References Cited

U.S. PATENT DOCUMENTS

| 4,135,234 | 1/1979 | Forge ....................................... 363/21 |
| 4,638,302 | 1/1987 | So et al. ........................... 330/347 DA |
| 4,884,038 | 11/1989 | Mijanic ................................. 330/165 |
| 5,057,774 | 10/1991 | Verhelst et al. ................... 324/158 R |
| 5,066,904 | 11/1991 | Bullock ................................. 324/127 |
| 5,179,301 | * 1/1993 | Hughes ................................. 327/335 |
| 5,276,359 | 1/1994 | Chiang ................................... 327/514 |
| 5,451,865 | 9/1995 | Coburn ................................... 324/127 |
| 5,541,878 | 7/1996 | LeMoncheck ................... 365/185.03 |
| 5,606,490 | 2/1997 | Hong ....................................... 363/56 |
| 5,629,891 | 5/1997 | LeMoncheck et al. ......... 365/185.03 |
| 5,652,547 | 7/1997 | Mokhtar et al. ..................... 330/279 |
| 5,673,221 | 9/1997 | Calligaro et al ..................... 365/168 |
| 5,714,894 | * 2/1998 | Redman-White et al. ............. 327/94 |
| 5,773,998 | * 9/1999 | Hughes et al. ......................... 327/91 |
| 5,783,952 | * 7/1998 | Kazazian ................................. 327/94 |
| 5,960,183 | * 9/1999 | Toumazou et al. ............. 395/500.04 |

* cited by examiner

Primary Examiner—Toan Tran
Assistant Examiner—Hai L. Nguyen
(74) Attorney, Agent, or Firm—Schnader Harrison Segal & Lewis LLP

(57) ABSTRACT

The present invention is directed to an integrated circuit having a current supply circuit for supplying a reference current and a signal current; at least one current copier circuit for creating a copy of the reference current and a copy of the signal current; an amplifying circuit connected to the reference supply circuit, the signal supply circuit, and the current copier circuit. The amplifying circuit is configured with the current copier circuit to compare the copy of the reference current to the signal current and to compare the copy of the signal current to the reference current and to generate a comparison signal based upon the comparisons. The present invention may also include an output circuit connected to the amplifying circuit for receiving the comparison signal and generating an output signal and a current mode circuit for receiving the output signal.

24 Claims, 6 Drawing Sheets

CURRENT COMPARATOR FOR CURRENT MODE CIRCUITS

BACKGROUND OF THE INVENTION

1. Field of the Invention

The present invention is directed to current comparators, particularly to a current comparator which makes use of cross-coupled current copiers to perform two comparisons of the reference and the signal currents.

2. Description of the Prior Art

Recently, current mode circuits have been the subject of much research. This is due to their potential to operate faster that their equivalent voltage mode circuits and the fact than the voltage swing on the internal nodes is small. Thus, current mode circuits tend to generate less noise than their voltage counterparts and can be used in applications with lower supply voltages.

A number of current mode ADCs have been designed and published in the prior art. The central comparison performed in these ADCs is to use current mirrors or current copiers to supply the reference and signal currents. A current to voltage conversion is carried out at the high output impedance of the current mirrors or current copiers, followed by some voltage detection and amplification.

However, these prior art comparators suffer from the significant drawback that in these systems one of the mirrors is connected to the power supply, while the other is connected to the ground supply. Consequently, any noise present on one of the supplies but not the other may affect the comparison, reducing the efficiency of the circuit.

An improved current comparator is therefore needed which significantly reduces the supply noise rejection problem while maximizing the overall gain of the circuit.

SUMMARY OF THE INVENTION

The present invention is directed to an integrated circuit which includes a current supply circuit for supplying a reference current and a signal current; at least one current copier circuit for creating a copy of the reference current and a copy of the signal current; an amplifing circuit connected to the current supply circuit and the current copier circuit. The amplifying circuit is configured with the current copier circuit to compare the copy of the reference current to the signal current and to compare the copy of the signal current to the reference current and to generate a comparison signal based upon these comparisons. The present invention also includes an output circuit connected to the amplifying circuit for receiving the comparison signal and generating an output signal and a current mode circuit for receiving the output signal from the output circuit.

DETAILED DESCRIPTION

The present invention will be understood more fully from the detailed description given below and from accompanying drawings of preferred embodiments of the invention, which, however, should not be taken to limit the invention to a specific embodiment, but are for explanation and understanding only.

The present invention overcomes the power supply noise rejection problem of prior art integrated circuits by effectively supplying both the reference current and signal current to the current comparator from one supply, and storing versions of each current for use in comparison, resulting in that any noise that is common to both will tend to be rejected. The invention also doubles the gain of the comparator of the integrated circuit by virtue of the fact that two comparisons are carried out instead of just one. This increases the resolution by one bit over the standard comparator.

Figure 1:
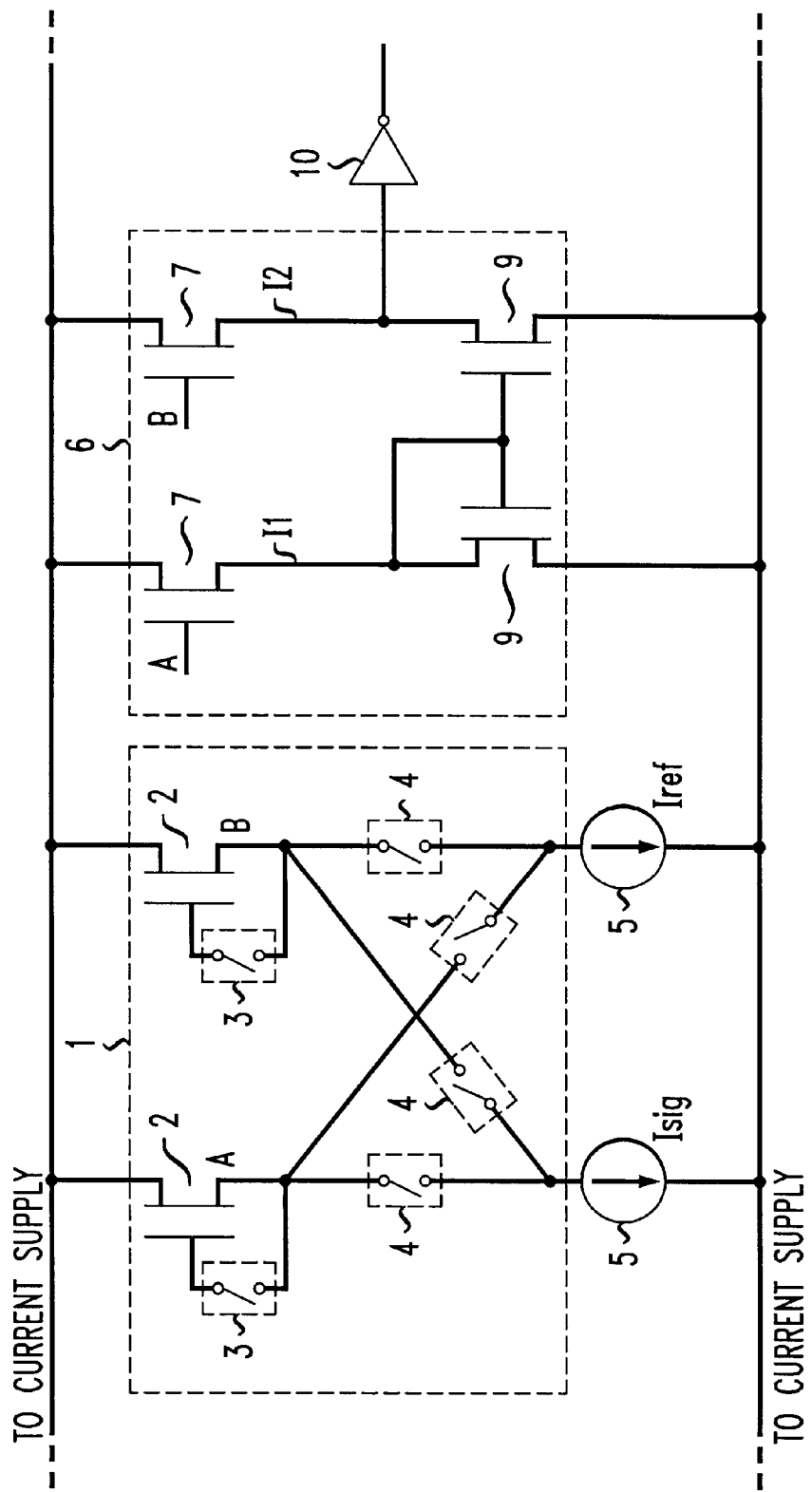
FIG. 1 is a schematic illustrating a preferred embodiment of the current comparator of present invention.

A preferred embodiment of the invention is an integrated circuit used as a current mode circuit, such as a current-mode ADC, although it is certainly not limited thereto. It is likely that current mode circuits will see increasing popularity as supply voltages shrink (and the voltage swing seen on nodes also decreases accordingly) and so this invention has the potential to be used in a great many products in the future. Examples of current mode circuits which can be used as part of the present invention are disclosed in U.S. Pat. No. 5,999,454, entitled Sense Amplifier For Flash Memory, filed on Aug. 19, 1998 on behalf of the inventor, Malcolm Smith, incorporated herein by reference As shown in FIG. 1, a preferred embodiment of the current comparator of the present invention includes Current Copier Circuit 1, which may comprise MOS Transistors 2, which have their gates connected to their drain through Switches 3. Current Copier Circuit 1 also includes Current Switches 4, the operation of which will be described in more detail below. Both the reference current and the signal current are sent to Current Copier 1 from the current supply, as represented by Current Indicators 5 designated as Isig and Iref. The current supply may comprise a number of current supplies and circuits which are well known to those of ordinary skill in the art, such as a current mirror.

The preferred embodiment of the invention also includes Amplification Circuit 6, which includes MOS Transistors 7. The drains of MOS Transistors 7 are connected to MOS Transistors 9 in a conventional manner to generate an output signal to Inverter Circuit 10 for inversion. Inverter Circuit 10 may also comprise a Schmitt trigger for additional noise suppression.

Each gate of MOS Transistors 7 in Amplifier Circuit 6 are connected to Nodes A and B at the drain of MOS Transistors 2 in Current Copier Circuit 1. The interoperation of these components will be described in more detail below The input signal current from the current supply needs to be sampled and held before it is supplied Current Copier Circuit 1. The mirror circuit supplying the signal current may be attached through two switches Current Copier Circuit 1 in a conventional manner. The reference current, which may come from a digital-to-analog converter, or DAC (a current steering DAC being most preferred), is supplied by another current mirror circuit, which is again attached to the Current Copier Circuit through two switches in a conventional manner, as represented in FIG. 1.

The comparison of the copied currents and the reference and signal currents is carried out at the drains of MOS Transistors 2. These nodes (A and B) are used to drive MOS transistors 7 of Amplifier Circuit 6 to supply a differential output current to Inverter Circuit 10.

Figure 2:
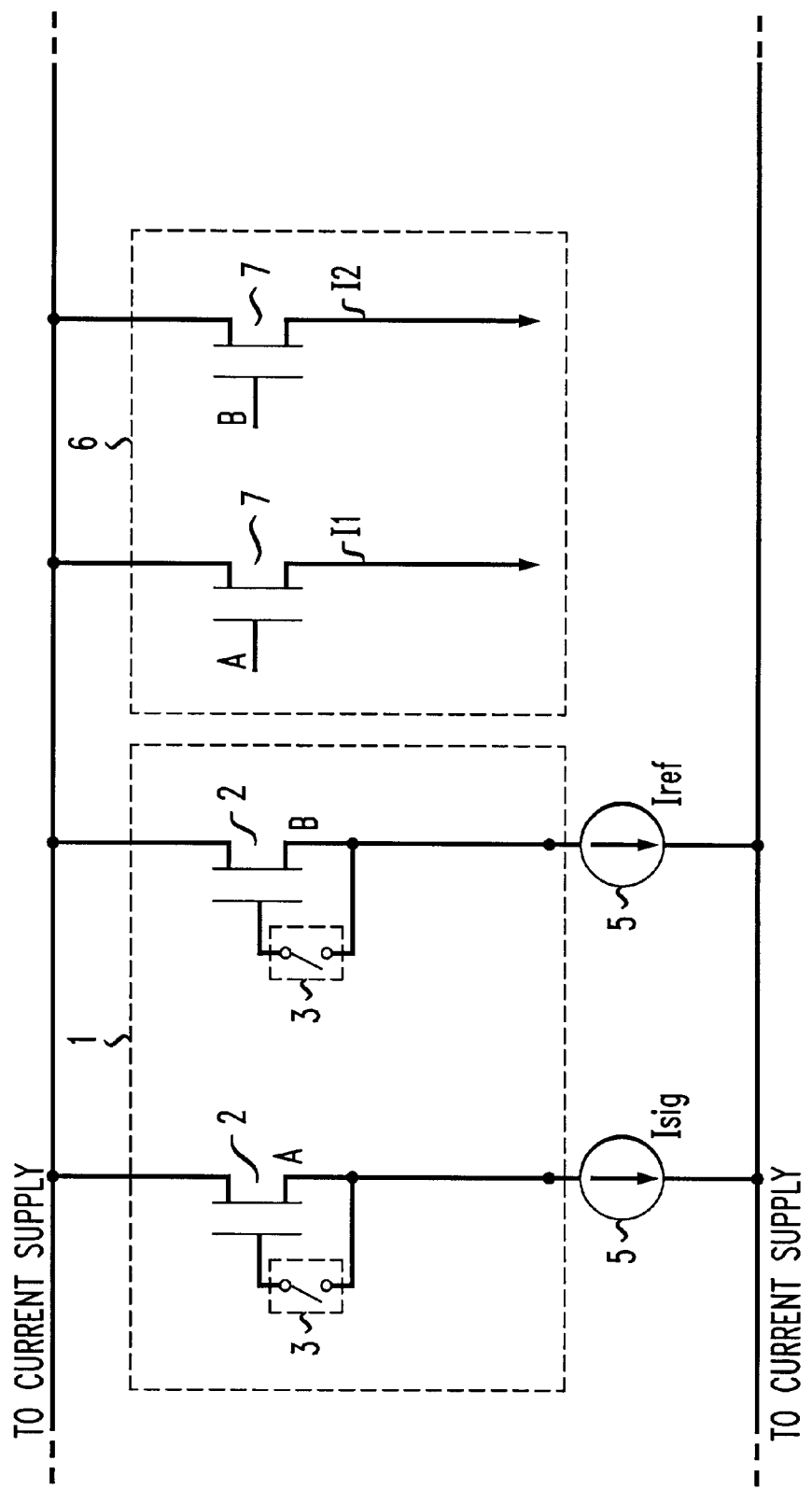
FIG. 2 is a schematic illustrating the copying phase of the preferred embodiment of the present invention.

In the copying phase, the switches between the gates and drains of the MOS Transistors 2 are closed. This is shown in FIG. 2. The reference current Iref is fed to one of the transistors through the appropriate Current Switch 4. Current Switch 4 between the other MOS Transistor 2 and the signal current is closed so the signal current is copied.

Figure 3:
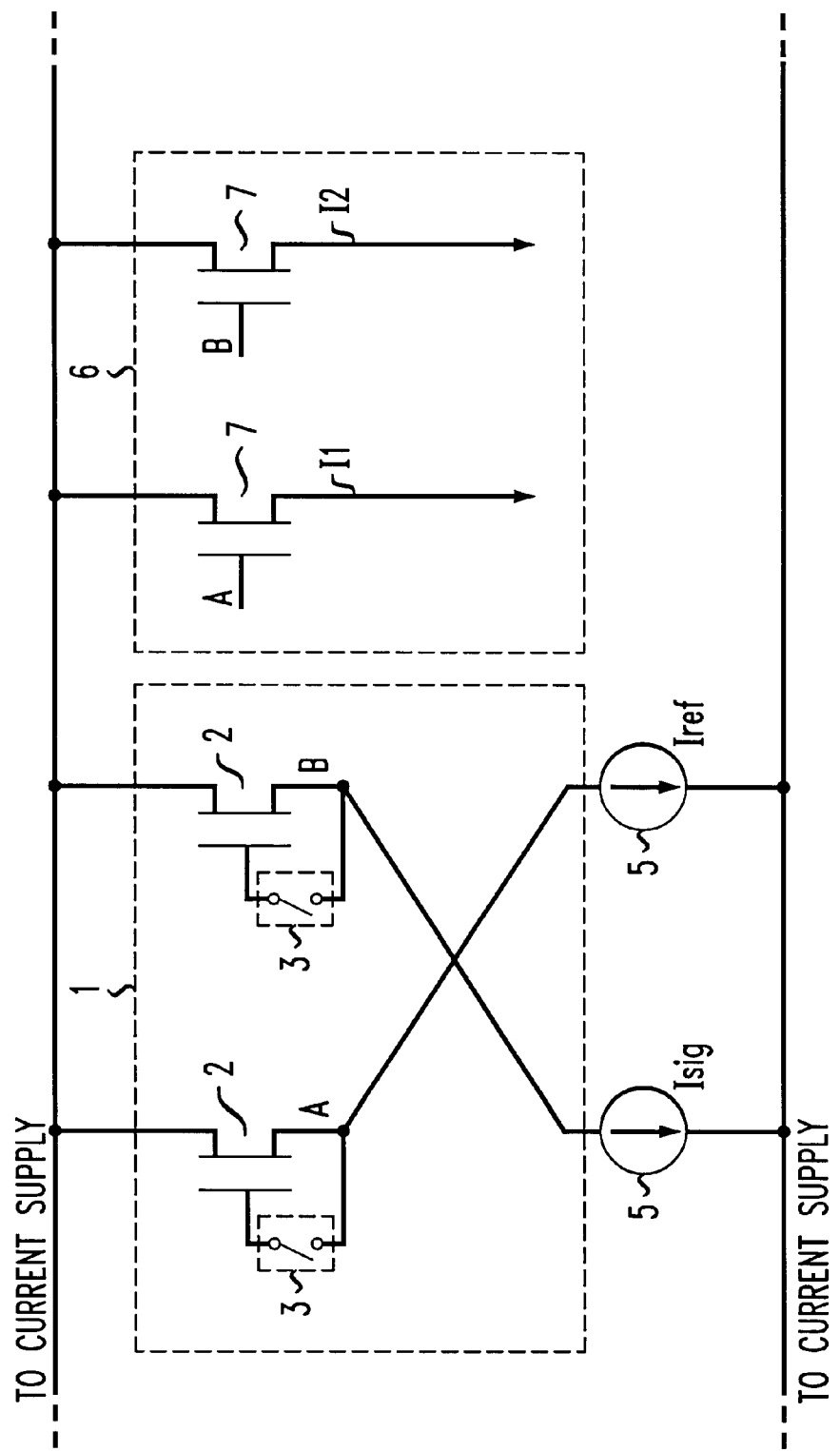
FIG. 3 is a schematic illustrating the comparison phase of the preferred embodiment of the present invention.

As shown in FIG. 3, in the comparison phase, Switches 3 between the gate and drain of the MOS Transistors 2 are opened, and the signal current Isig is routed through the other Switch 4 to the copier with the copy of the reference current. A comparison of the two currents is thus made at the drain of the reference current copier (Node B). Conversely, the reference current is routed through the appropriate Switch 4 to the copier with the copy of the signal current where the comparison takes place (Node A).

In the case where the copied current (whether reference or signal current) is more than the original mirrored current, then the drain of that node is pulled towards the copier rail. In the case where the mirrored current is more than the copier current, the copier drain node is pulled towards the mirror rail. This means that the drains of MOS Transistors 2 will be pulled in opposite directions and so one of the output currents will be larger than the other.

There are several ways the output current can be used to produce a logic output in accordance with the present invention. The simplest is a differential to single ended converter followed by an inverter (or Schmitt trigger for extra noise immunity) as shown in FIG. 1, described above. The current from one side is mirrored over to the other and the output node will be pulled towards the mirror supplying the larger current. This movement is converted to a logic output by the inverter.

Other possibilities to produce a logic output include the addition of extra stages of amplification before the differential to single ended conversion. Positive feedback may be added to these stages to further increase the gain. One such circuit is shown in FIG. 4.

Figure 4:
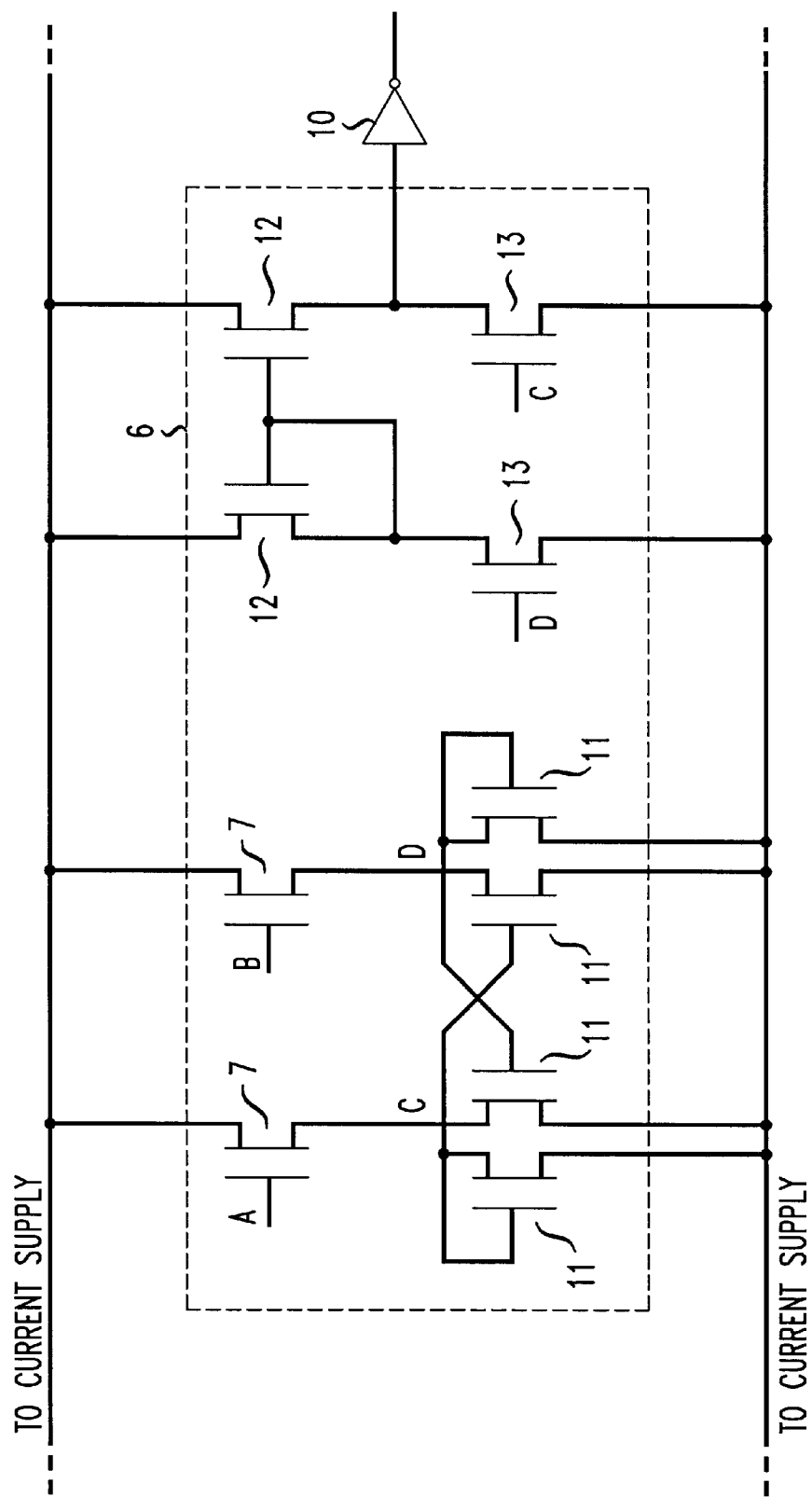
FIG. 4 is a schematic illustrating an embodiment of the current comparator of the present invention utilizing an additional amplification stage in the amplifying circuit.

As shown in FIG. 4, additional MOS Transistors 11, 12 and 13 are added and configured as shown to provide additional amplification of the compared currents from Nodes A and B at Nodes C and D. The comparison signal at Node C is then outputted to Inversion Circuit 10 in a manner similar to that describe in connection with FIG. 1. Again, A Schmitt Trigger circuit can be used here for noise suppression.

Additionally, an output latch could be used instead of the differential to single ended conversion circuit, as long as the system clock is phased in a conventional manner such that the latch is switched on after the signal is available to it. Further stages of gain could be included (with or without positive feedback) before the latch. An example of this is shown in FIG. 5.

Figure 5:
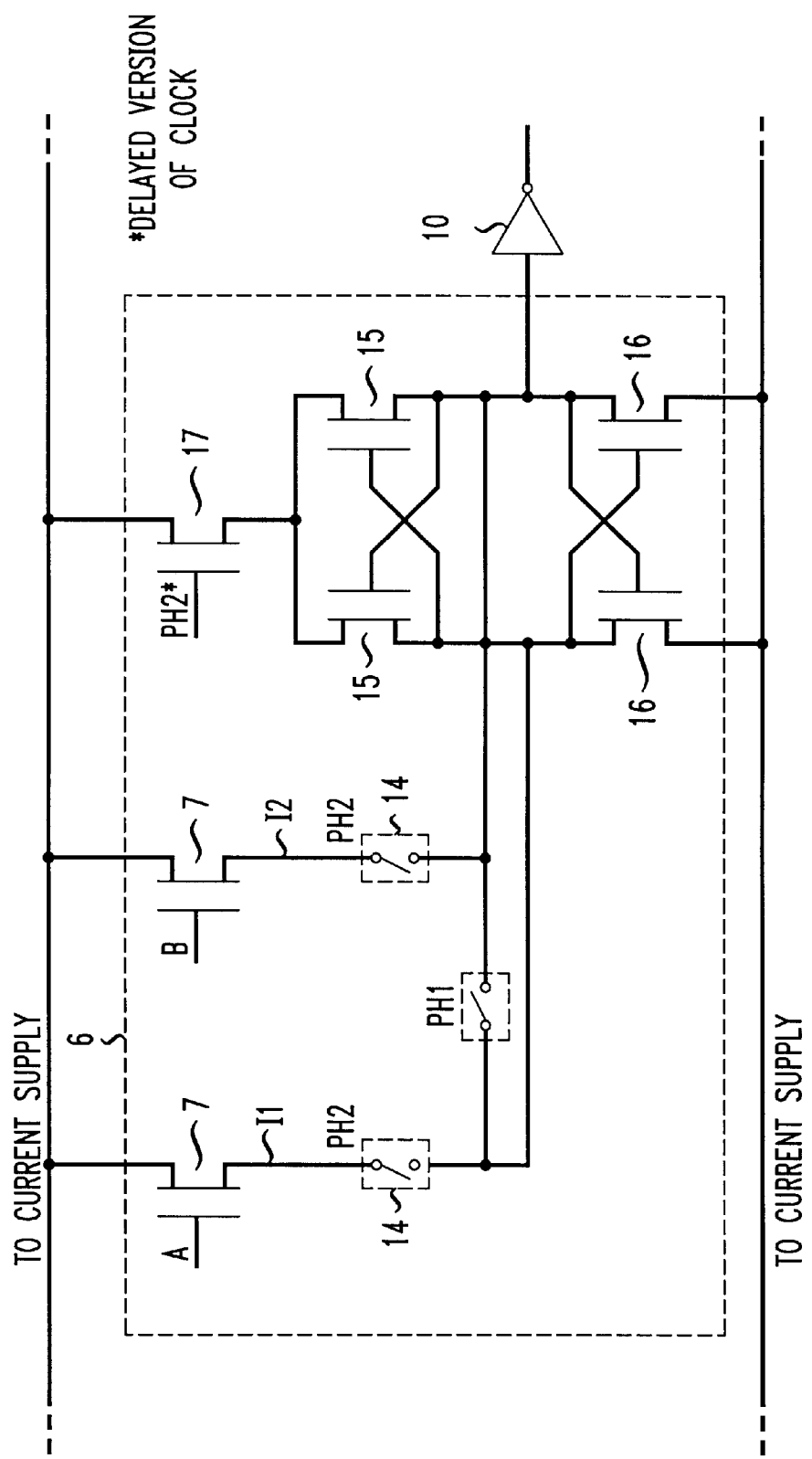
FIG. 5 is a schematic illustrating an embodiment of the current comparator of the present invention utilizing an output latch circuit in the output circuit.

As shown in FIG. 5, the compared currents I1 and 12 (described above) from Nodes A and B is passed through Switches 14 to the output latch, which comprises MOS Transistors 15 and 16, configured as shown. MOS Transistor 17 is used to input the comparison current at the predetermined clock phase PH2. Operation of the output latch at clock phase PH1 and PH2 is controlled by Switch 18, as shown. The resulting signal is then used by Inversion Circuit 10 to generate an output signal, in the same manner as previously described.

Figure 6:
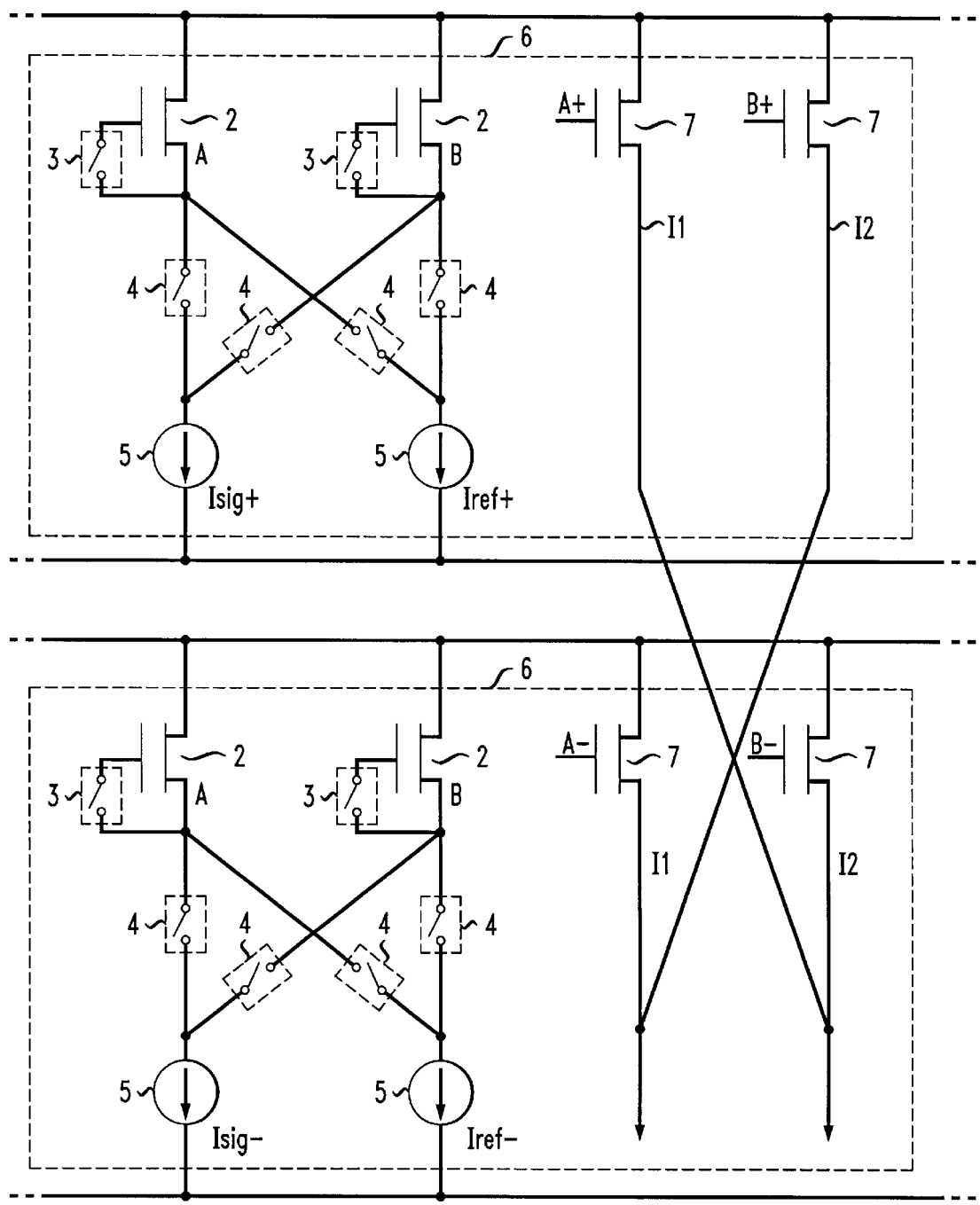
FIG. 6 is a schematic illustrating a full differential version of the current comparator of the present invention.

A fully differential version of the comparator uses two front end current copier circuits and combines their output currents in a common-back end amplifier and output circuit. An example of this is illustrated in FIG. 6. One front end circuit (similar to that shown in FIG. 1) compares Iref+ with Isig+, and the other (also similar to that shown in FIG. 1) compares Iref− with Isig−. The output currents is crossed over for one of the sub-comparators so that the currents add in the right manner.

While this invention has been described in conjunction with specific embodiments thereof, it is evident that many alternatives, modifications, and variations will be apparent to those skilled in the art. Accordingly, the preferred embodiments of the invention set forth herein are intended to be illustrative, not limiting. Various changes may be made without departing from the spirit and scope of the invention as defined in the appended claims.

What is claimed is:

1. An integrated circuit comprising:
   (a) a current supply circuit for supplying a reference current and a signal current to said integrated circuit;
   (b) at least one current copier circuit for creating a copy of said reference current and a copy of said signal current comprising a first pair of MOS transistors;
   (c) an amplifying circuit connected to said current supply circuit and said current copier circuit, comprising a second pair of MOS transistors each having its gate directly connected to a drain of one said first pair of MOS transistors, said connections being the only connections between the first and second pair of MOS transistors, said amplifying circuit being configured with said current copier circuit to compare said copy of said reference current to said signal current and to compare said copy of said signal current to said reference current and to generate a comparison signal based upon said comparisons; and
   (d) an output circuit connected to said amplifying circuit for receiving said comparison signal and generating an output signal.

2. The integrated circuit of claim 1, wherein said current supply circuit comprises a current mirror.

3. The integrated circuit of claim 2, wherein said reference current is supplied to said current mirror by a digital-to-analog converter.

4. The integrated circuit of claim 2, wherein said signal current is supplied to said current mirror by a sample and hold circuit.

5. The integrated circuit of claim 1, wherein said amplifying circuit compares said copy of said reference current to said signal current and said copy of said signal current to said reference current, and generates said single ended voltage signal through a differential to single end conversion.

6. The integrated circuit of claim 1, wherein said output circuit is a thresholding circuit.

7. The integrated circuit of claim 1, wherein said output signal is a logic output.

8. The integrated circuit of claim 1, wherein said output circuit is a latched output circuit.

9. The integrated circuit of claim 1, wherein said current copier circuit comprises two current copiers, and wherein said amplifying circuit further comprises a third pair of MOS transistors, and wherein said current copiers are configured with two differential signals being combined into a single differential signal in said amplifying circuit.

10. A method of comparing currents in a current mode circuit comprising the steps of:

(a) providing an integrated circuit comprising:
  (1) a current supply circuit for supplying a reference current and a signal current to said integrated circuit;
  (2) at least one current copier circuit for creating a copy of said reference current and a copy of said signal current comprising a first pair of MOS transistors;
  (3) an amplifying circuit connected to said current supply circuit and said current copier circuit, comprising a second pair of MOS transistors each having its gate directly connected to a drain of one said first pair of MOS transistors, said connections being the only connections between the first and second pair of MOS transistors, said amplifying circuit being configured with said current copier circuit to compare said copy of said reference current to said signal current and to compare said copy of said signal current to said reference current and to generate a comparison signal based upon said comparisons; and
  (4) an output circuit connected to said amplifying circuit for receiving said comparison signal and generating an output signal;
(b) (supplying a reference current and a signal current from a current supply;
(c) copying said reference current and said signal current;
(d) comparing said copy of said reference current to said signal current and said copy of said signal current to said reference current to generate a comparison signal based upon said comparisons; and
(e) generating and output signal based upon said comparison signal.

11. The method of claim 10, wherein said comparison signal is a single ended voltage signal generated through a differential to single end conversion.

12. The method of claim 10, wherein said output signal is a logic output.

13. A current mode comparator comprising:
  (a) a current supply circuit for supplying a reference current and a signal current to said current comparator;
  (b) at least one current copier circuit for creating a copy of said reference current and a copy of said signal current, comprising a first pair of MOS transistors;
  (c) an amplifying circuit connected to said current supply circuit and said current copier circuit, comprising a second pair of MOS transistors each having its gate directly connected to a drain of one said first pair of MOS transistors, said connections being the only connections between the first and second pair of MOS transistors, said amplifying circuit being configured with said current copier circuit to compare said copy of said reference current to said signal current and to compare said copy of said signal current to said reference current and to generate a comparison signal based upon said comparisons; and
  (d) said output circuit connected to said amplyfying circuit for receiving said comparison signal and generating an output signal.

14. The current comparator of claim 13, wherein said current supply circuit comprises a current mirror.

15. The current comparator of claim 14, wherein said reference current is supplied to said current mirror by a digital-to-analog converter.

16. The current comparator of claim 14, wherein said signal current is supplied to said current mirror by a sample and hold circuit.

17. The current comparator of claim 13, wherein said amplifying circuit compares said copy of said reference current to said signal current and said copy of said signal current to said reference current, and generates said single ended voltage signal through a differential to single end conversion.

18. The current comparator of claim 13, wherein said output circuit is a thresholding circuit.

19. The current comparator of claim 13, wherein said output signal is a logic output.

20. The current comparator of claim 13, wherein said output circuit is a latched output circuit.

21. The current comparator of claim 13, wherein said current copier circuit comprises two current copiers wherein said amplifying circuit further comprises a third pair of MOS transistors, and wherein said current copiers are configured with two differential signals being combined into a single differential signal in said amplifying circuit.

22. A method of comparing currents in a current mode circuit comprising the steps of:
  (a) providing a current mode comparator comprising one:
    (1) a current supply circuit for supplying a reference current and a signal current to said current comparator;
    (2) at least one current copier circuit for creating a copy of said reference current and a copy of said signal current, comprising a first pair of MOS transistors;
    (3) an amplifying circuit connected to said current supply circuit and said current copier circuit, comprising a second pair of MOS transistors each having its gate directly connected to a drain of one said first pair of MOS transistors, said connections being the only connections between the first and second pair of MOS transistors, said amplifying circuit being configured with said current copier circuit to compare said copy of said reference current to said signal current and to compare said copy of said signal current to said reference current and to generate a comparison signal based upon said comparisons; and
    (4) said output circuit connected to said amplifying circuit for receiving said comparison signal and generating an output signal;
  (b) supplying a reference current and a signal current from a current supply;
  (c) copying said reference current and said signal current;
  (d) comparing said copy of said reference current to said signal current and said copy of said signal current to said reference current to generate a comparison signal based upon said comparisons; and
  (e) generating and output signal based upon said comparison signal.

23. The method of claim 22, wherein said comparison signal is a single ended voltage signal generated through a differential to single end conversion.

24. The method of claim 22, wherein said output signal is a logic output.

* * * * *